United States Patent [19]

Kelley

[11] Patent Number: 4,775,280
[45] Date of Patent: Oct. 4, 1988

[54] APPARATUS FOR AUTOMATICALLY SUPPLYING ELECTRICAL COMPONENTS

[75] Inventor: John S. Kelley, Wenham, Mass.

[73] Assignee: USM Corporation, Farmington, Conn.

[21] Appl. No.: 889,449

[22] Filed: Jul. 23, 1986

[51] Int. Cl.⁴ ............................................... H05K 3/30
[52] U.S. Cl. ...................... 414/414; 29/741; 221/11
[58] Field of Search .................. 221/11, 106, 197; 414/403, 411, 414; 29/739–741, 832, 837–839

[56] References Cited

U.S. PATENT DOCUMENTS

| | | | |
|---|---|---|---|
| 381,397 | 4/1888 | Marelle | 221/152 |
| 3,099,501 | 7/1963 | Hillson et al. | 384/19 |
| 3,374,924 | 3/1968 | Fegley | 221/11 |
| 3,655,080 | 4/1972 | Gianese | 414/414 |
| 4,401,234 | 8/1983 | Deoira et al. | 221/106 |
| 4,500,246 | 2/1985 | Janisiewicz et al. | 414/403 |

Primary Examiner—H. Grant Skaggs
Attorney, Agent, or Firm—Spencer T. Smith

[57] ABSTRACT

An apparatus for automatically supplying electrical components from a series of tubular holders held in a cassette to the magazine of an electrical component assembly machine. The apparatus is carried on a channel base movable from a position with the cassette over the workstation to a position with the cassette remote from the workstation. The components are released from the cassette down a chute to the workstation, the chute having a stop member releasable when the channel base is moved to prevent the release of components from the chute. A component presence reader is located in the chute and is disposed at an acute angle to the chute vertical axis to obtain an accurate reading of the presence or absence of a component in the chute.

4 Claims, 6 Drawing Sheets

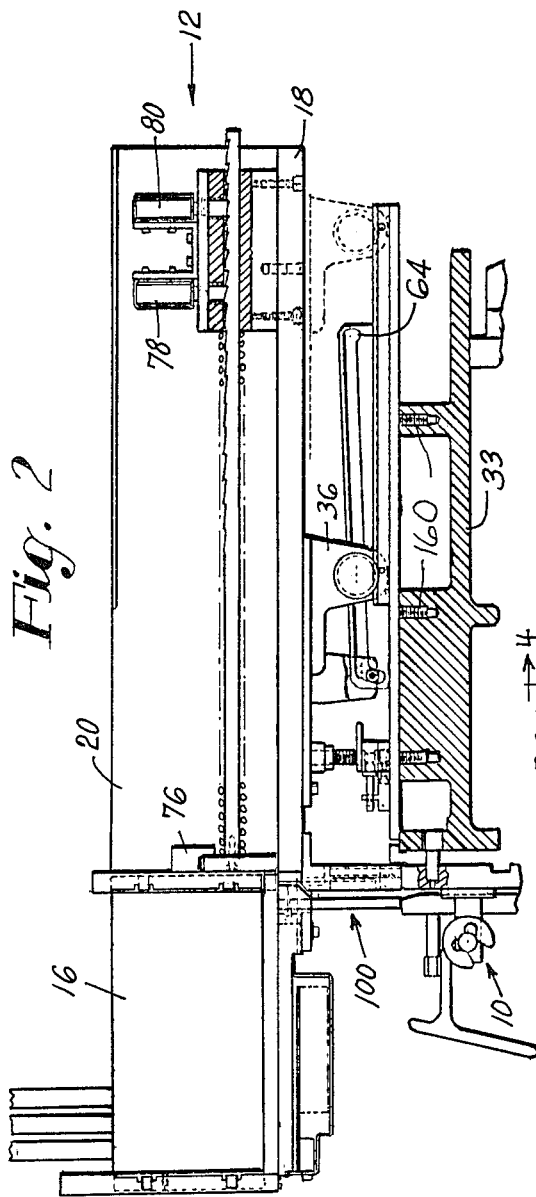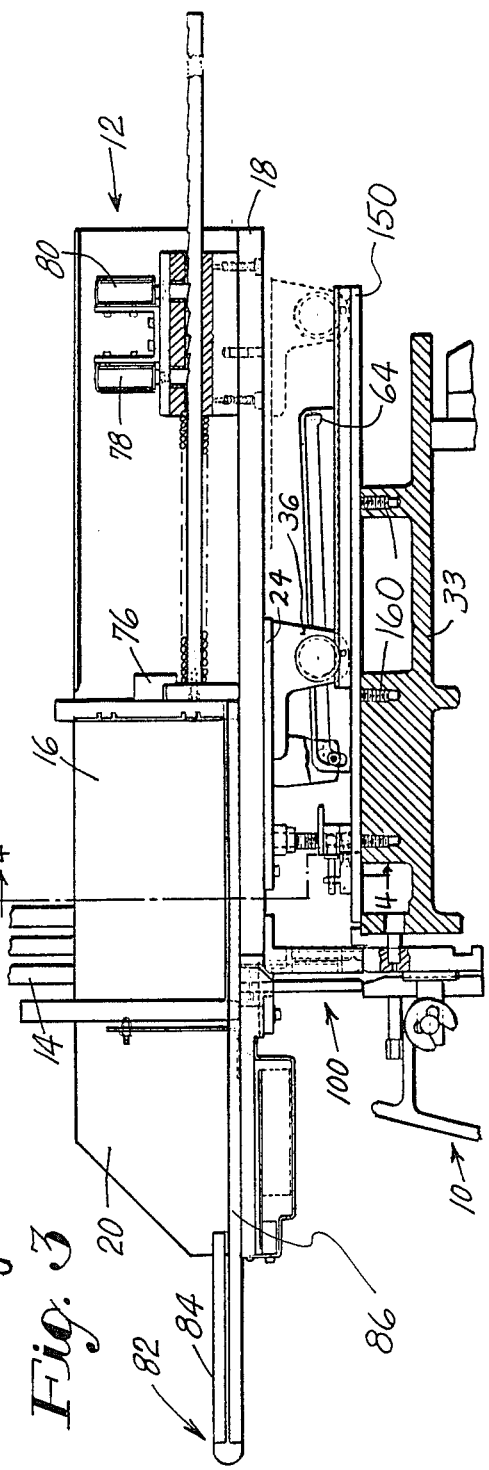

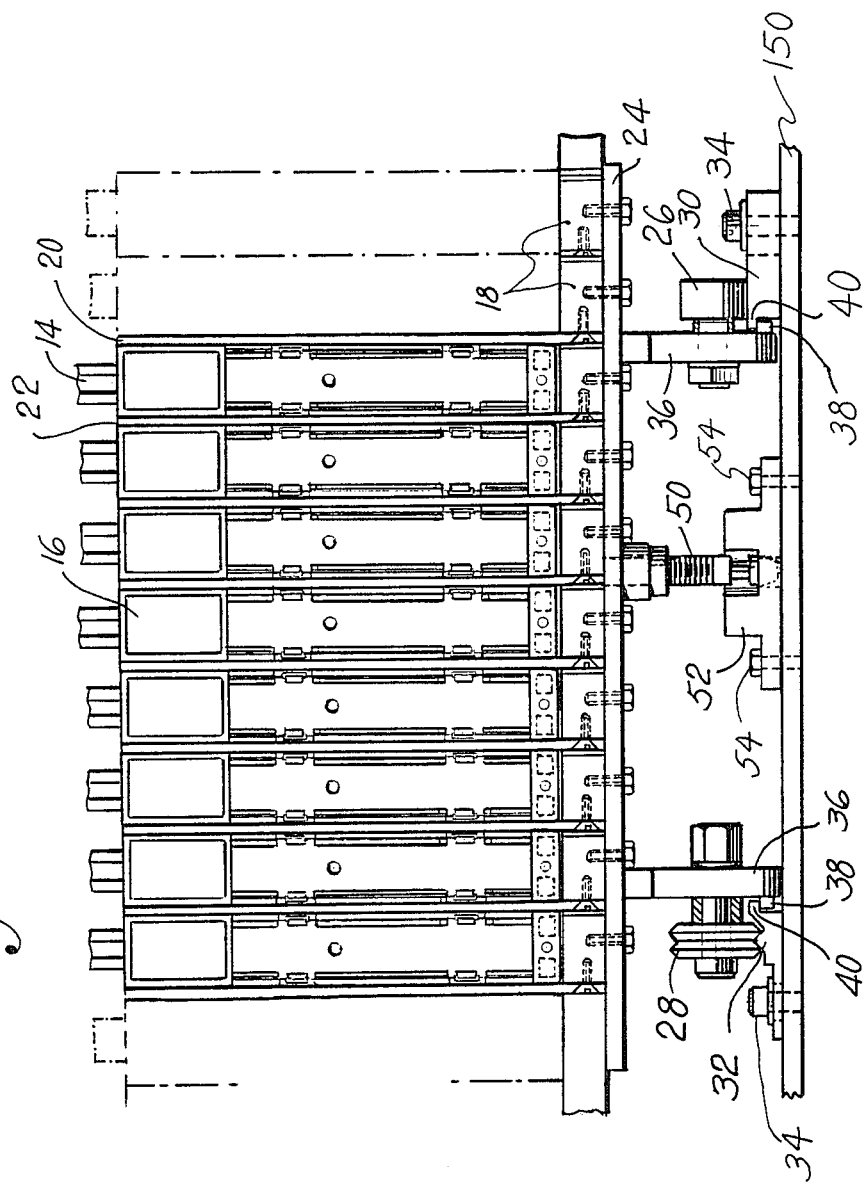

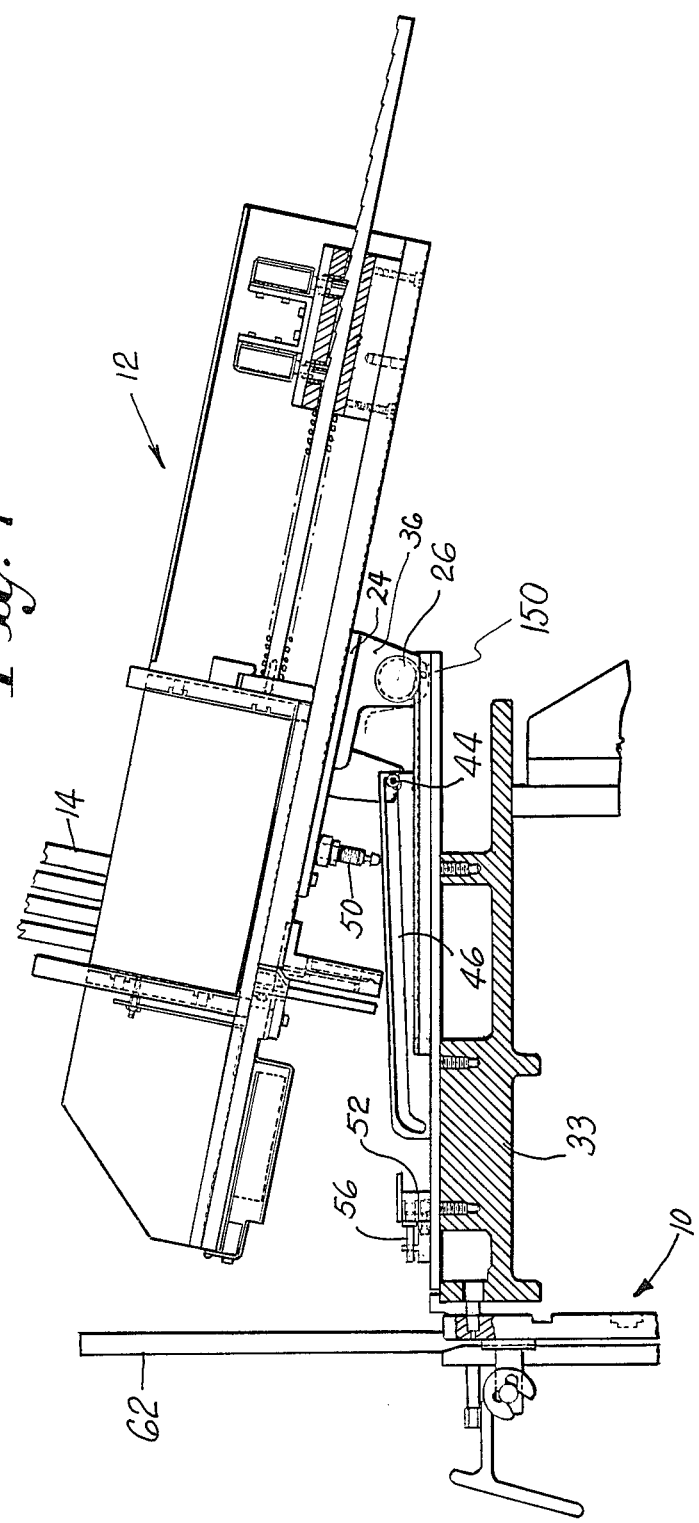

APPARATUS FOR AUTOMATICALLY SUPPLYING ELECTRICAL COMPONENTS

BACKGROUND OF THE INVENTION

1. Field of the Invention

This invention relates to an apparatus for automatically supplying electrical components to a station of a machine which automatically assembles electrical components to printed circuit boards.

2. Summary of the Prior Art

In machines for automatically assembling DIP type components to printed circuit boards, a plurality of tubular holders containing the components in linear array are mounted on the machine above a station from which the components are selected and then transported to an assembly head which inserts the leads of the component into the preselected openings in the board. A machine of this type is illustrated in commonly owned U.S. Pat. No. 4,063,347. In practice, as the tubular holders (called sticks) are emptied of the components, another holder will be substituted at that station. To eliminate the necessity of the machine operator continually replacing empty holders during the operation of the machine, it is desirable to provide an apparatus to mount a plurality of holders in a series so that an empty holder can automatically be replaced with a full holder. An example of such an apparatus is illustrated in U.S. Pat. No. 4,401,234.

The prior art devices, hwwever, have required the operator to remove the empty holder before a full holder can be properly positioned at the station.

SUMMARY OF THE INVENTION

It is an object of this invention to provide an apparatus which mounts a plurality of tubular holders containing electrical components in series above a work station so that as a holder is emptied of components, a full holder is automatically positioned above the workstation.

It is a further object of this invention to provide an apparatus for automatically indexing tubular holders above a magazine leading to a workstation wherein the apparatus can easily be removed from the workstation so that other holders can be manually positioned above the workstation.

It is an additional object of this invention to provide an automatic tubular component holder indexing apparatus which can be removed from a workstation and automatically contain the electrical components in the apparatus.

It is also an object of this invention to povide in an automatic cassette indexing apparatus, a sensing means to detect that a holder in the cassette is empty to cause a full holder to index to a workstation.

It is also an object of this invention to provide in an automatic cassette indexing apparatus a sensor detecting that all the component holders in the cassette are empty and visually indicate that the empty cassette should be replaced with a full cassette.

It is still a further object of this invention to provide a sensor at an angle to a component chute to detect that any configuration of component including "open" sockets is not present in the chute.

BRIEF DESCRIPTION OF THE DRAWINGS

FIG. 2 is a side elevational view of the apparatus showing the cassette holding the tubular holders being loaded into the apparatus;

FIG. 3 is a side elevational view of the apparatus showing the cassette loaded into the apparatus;

FIG. 4 is a front view taken along the line 4—4 of FIG. 3 showing the mounting for the apparatus;

FIG. 7 is a side elevational view of the apparatus tilted and moved rearward so that a single tubular holder can be placed on the assembly machine workstation.

DESCRIPTION OF THE PREFERRED EMBODIMENT

Figure 1:
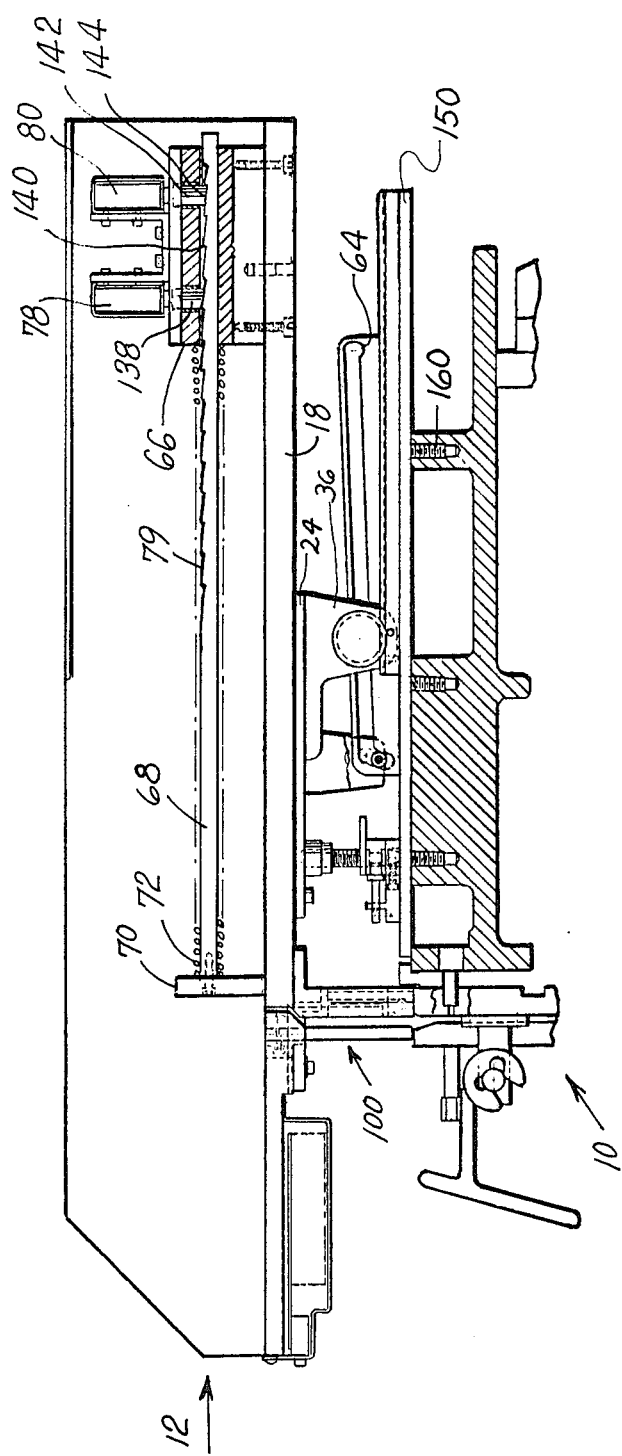
FIG. 1 is a side elevational view of the apparatus of this invention.

The apparatus of this invention is designed to be used in a machine for automatically assembling electrical components to printed circuit boards. A machine of this latter type is illustrated in U.S. Pat. No. 4,063,347. In this type of assembly machine, there is a magazine 10 above a workstation, (FIGS. 1,2,3 and 7) which is adapted to receive tubular holders containing DIP components in a stacked array, with the components being selected at the workstation in predetermined sequence for transport to an insertion head of the machine. In normal practice, the machine operator would replace the tubular holders as they become empty with a full holder. This is a time consuming operation since the operator must continuously observe the holders and be prepared to replace the empty holder with a proper full holder.

With the apparatus 12 of this invention, a plurality of tubular holders 14 are held in series in a cassette 16 above the magazine 10 and as a holder becomes empty, the apparatus 12 will automatically index a full holder over magazine 10 so that the assembly machine operation is not interrupted. With this novel arrangement, the operator need only be prepared to replace a cassette 16 in the apparatus 12 when the last of the tubular holders of a given cassette 16 has been emptied of components.

Attention is directed to FIGS. 1 to 5 which illustrate the apparatus 12 having channel bases 18 with a plurality of upstanding spaced sheet metal partitions 20 providing spaces 22 for receipt of the cassettes 16 containing the tubular holders 14. The channel bases 18 are mounted on a bracket 24 and a pair of rollers 26, 28 are mounted on support 36. The roller 26 rides on a rail 30 and the roller 28 is v-grooved and rides on a rail 32 to maintain alignment. The rail 32 is adjustably secured to the mounting plate 150 by bolt 34 so that the position of rail 32 on the mounting plate 150 can be adjusted for proper alignment. The rails 30 and 32 are mounted on the mounting plate 150 by bolts 34 and the plate 150 is mounted to the machine frame by bolts 160 (see FIGS. 1 to 4). The lower edges of the support 36 contain pins 38 riding under the lips 40 of the rails 30 and 32 to lock the rollers on their respective rails. Mounted on a bracket 42 carried on bracket 24 is a cross pin 44 riding in a slot 46 of rail 48 mounted to the mounting plate 150 (see FIG. 5).

A pin 50 is mounted to the underside of bracket 24 and is received in block 52 bolted at 54 to the mounting plate 150. The connection of block 52 to plate 150 is adjustable to obtain proper alignment. A pin 56 passes through the opening 58 in block 52 and is received in the recess 60 in pin 50 to lock the apparatus 12 in the lowered position.

Attention is now directed to FIG. 7 which illustrates the operation of the above described mounting permitting the entire apparatus 12 to be moved rearward so that an individual tubular holder 62 can be inserted into workstation 10. By releasing pin 56 from recess 60 of pin 50, the apparatus 12 can be tilted about rollers 26, 28 and moved rearwardly to the position illustrated in FIG. 7 wherein pin 44 will be received in recess 64 (FIG. 1) of slot 46 to lock the apparatus 12 in the tilted position.

Mounted in a block 66 secured to channel base 18 is a rod 68 having an abutment 70 (FIG. 1). A spring 72 acts between the block 60 and abutment 70. The cassettes 16 each have a rear wall 74 with a latch 76 adapted to be received over the abutment 70 (see FIGS. 4 and 5). The rods 68 each have ratchets 79 engaging solenoids 78, 80 mounted on block 66.

In the loading and placement of individual cassettes 16, a tool 82 having a handle 84 and upstanding side walls 86 is placed on the open bottom of the cassette so that the side walls 86 extend over the cassette side walls 88. The loaded tubular holders are then inserted down into the spaced openings 90 of the cassette. Springs 92 act against the holders to hold them in place in the cassettes. The loaded cassette is then placed between the partition and the latch 76 is inserted over the abutment 70. The handle 84 has a post 94 with a pin 96 inserted into the front wall 98 of the cassette. The operator can then grip handle 84 and move the cassette into the space 22 between partition's 20 against the bias of spring 72 (See FIGS. 2 and 3). At this time, the solenoids 78 and 80 will pass along ratchet 79 until the cassette is in the rearward position with the foremost tubular holder above the component guide chute 100 of apparatus 12 (See FIG. 5). At this position, the solenoid 80 will rest in one of the ratchets 79. Thereafter, the tool 82 can be slid out of the underside of the cassette and the components in the cassette will rest on channel base 18.

Figure 5:
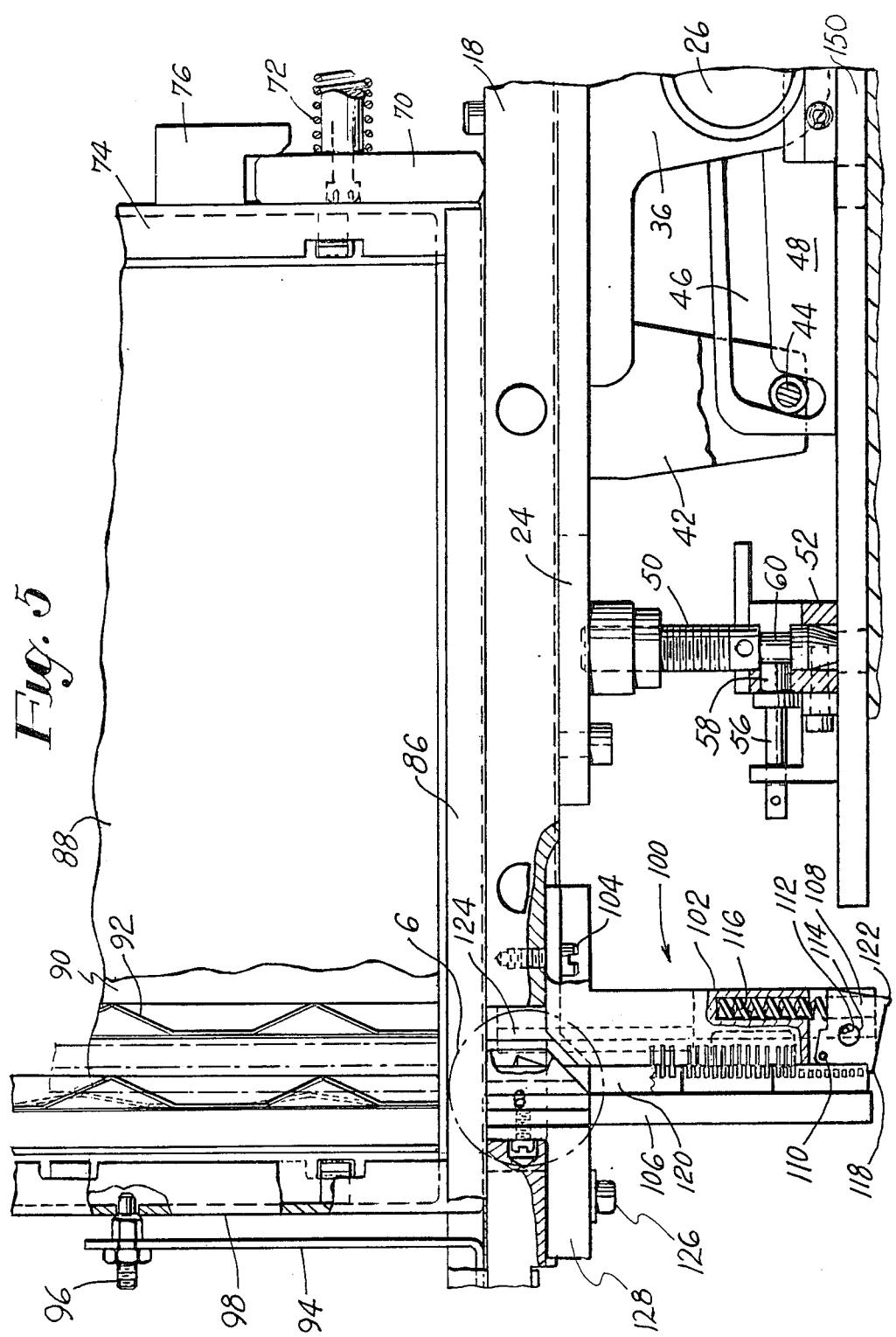
FIG. 5 is a side view partially broken away and partially in section of the mounting of the apparatus and the component guide section.

Attention is now directed to FIG. 5 which illustrates the details of the component guide chute 100 which is positioned over the magazine 10. A component chute 102 is secured at 104 to the underside of the channel base 18. The components are received out of the bottom of the tubular holders with the component body resting against guide bar 106 secured to channel base 18. The leads of the component straddle the chute 102 and are contained in vertical grooves of chute 102. A stop member 108 is carried on a pin 110 in chute 102. A pin 112 in enlarged opening 114 in member 108 permits a spring 116 to downwardly bias the member 108 to a position wherein the lip 118 on member 108 extends into the track 120 between member 102 and guide bar 106 to prevent the component from passing through the guide chute 100.

In the operation of guide chute 100, the components are gravity fed from the tubular holders down through the guide chute to the workstation (not shown). When the guide chute 100 is placed over the magazine 10, the edge 122 of stop member 108 will contact the upper surface (not shown) of the magazine pivoting the stop member 108 about pin 110 against the bias of spring 116 to remove the lip 118 from track 120 permitting the components to fall from chute 100 into the magazine 10. When, however, the apparatus 12 is tilted and moved rearward, the release of edge 122 will cause spring 116 to bias the stop member 108 to a position placing lip 118 in track 120 to prevent the components from falling out of chute 100.

Figure 6:
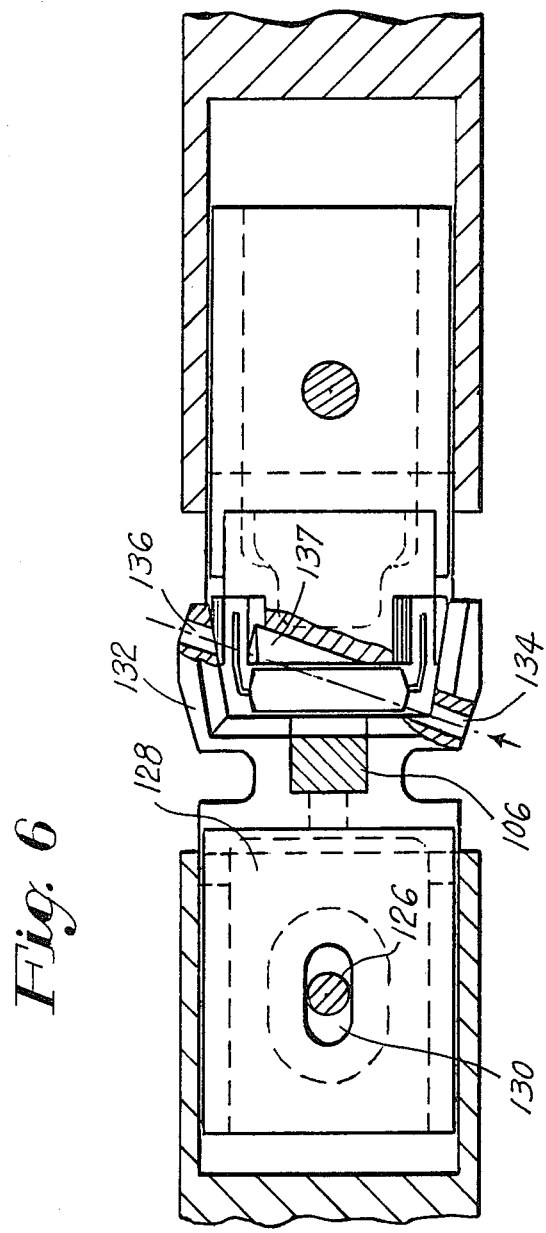
FIG. 6 is an enlarged sectional view of the area 6 shown in FIG. 5 and illustrating the area of a photocell that signals the apparatus control the presence or absence of a component in the component feeder section.

Attention is now directed to FIGS. 5 and 6 which illustrate the position of a photocell (not shown) that will give an accurate input to the machine control that there is a component present in the receiving end 124 of chute 102. Attached to the support 18 by bolt 126 is an upper support 128 carrying guide bar 106. The support 128 has a slot connection 130 permitting the guide bar 106 to be moved toward or away from member 102 to change the size of the track 120 in chute 100 to accommodate various sizes of components. The support 128 has a forward extension 132 with openings 134, and 136 accommodating the sender and receiver of the photocell. The receiving end 124 of chute 102 is relieved at 137 to give a clear opening for the photocell. It should be noted that the openings 134, 136 are disposed at an angle to the track 120 and thus at an angle to the body of the component. It has been found that this assures an accurate reading in the track 120, versus reading normal to the axis of the track and possibly reading through the opening in a socket which also may be handled by this apparatus. The photo cell being thus located at an angle to the component body also assures accurate reading when the component size is much smaller than the track opening 120.

In operation, to automatically index the cassette forward to remove an empty holder and place a full holder above chute 100, a reading of the photocell through openings 134, 136 will indicate to the machine control that the chute 100 is empty. This will raise solenoid 80 causing spring 72 to move the cassette forward until solenoid shaft 138 of solenoid 78 engages a shoulder 140 on ratchet 79. Thereafter, solenoid shaft 142 of solenoid 80 will engae a sloped surface 144 of ratchet 79. Raising solenoid shaft 138 of solenoid 78 will cause spring 72 to move the cassette forward until shaft 142 of solenoid 80 abuts a shoulder 140 on ratchet 79. At this point, a new full holder will be positioned above chute 100. In this manner, the cassette can be indexed to a position to continuously supply components to the chute 100. When the last holder in series is emptied, the machine control will indicate to the machine operator that the cassette should be replaced. Then, the cassette can be removed and a full cassette inserted for the continuous uninterrupted operation of the assembly machine.

What is claimed is:

1. An apparatus for supplying electronic components to a workstation of a machine for placing the components on a printed circuit board comprising:
    at least one cassette for containing a series of tube holders adapted to be sequentially relocated forwardly to a feed position.
    a housing including a base for supporting said cassette,
    component guide chute means secured to the bottom of said base for receiving electronic components from the tube holders and guiding the received electronic components to the workstation,
    mounting plate means, and means for mounting said housing base on said mounting plate means for rearward displacement from an advanced feed position whereat said component guide chute means will guide electronic components to the workstation to a retracted position whereat said housing will be remote from the workstation so that an individual tube holder can be inserted into said workstation, said housing base mounting means including a cam surface means of said mounting plate means and follower means on said housisng base for rotating said housing base to raise said component guide chute means so that said component guide chute means will not strike said mounting plate means as said housing base is displaced to said retracted position.

2. An apparatus according to claim 1 wherein said housing base mounting means further comprises means for releasably securing said housing base at said advanced feed position.

3. An apparatus according to claim 2 wherein said housing base further comprises rails on said mounting plate means and rollers carried on said housing base.

4. An apparatus according to claim 1 wherein said component guide chute means comprises stop means for preventing electronic components from being fed downwardly when said housing base is displaced away from said advanced feed position.

* * * * *